(12) United States Patent
Lott et al.

(10) Patent No.: US 10,816,508 B2
(45) Date of Patent: Oct. 27, 2020

(54) PLANAR ARRAY PIPELINE INSPECTION TOOL

(71) Applicant: Exxam Systems, LLC, Anchorage, AK (US)

(72) Inventors: Paul Lott, Anchorage, AK (US); Yuan Ji, Ames, IA (US)

(73) Assignee: Exxam Systems, LLC, Anchorage, AK (US)

( * ) Notice: Subject to any disclaimer, the term of this patent is extended or adjusted under 35 U.S.C. 154(b) by 133 days.

(21) Appl. No.: 16/216,608

(22) Filed: Dec. 11, 2018

(65) Prior Publication Data

US 2019/0219541 A1    Jul. 18, 2019

Related U.S. Application Data

(60) Provisional application No. 62/597,404, filed on Dec. 11, 2017.

(51) Int. Cl.
| | | |
|---|---|---|
| *G01N 27/82* | (2006.01) | |
| *G01R 33/02* | (2006.01) | |
| *G01M 3/40* | (2006.01) | |
| G01R 33/09 | (2006.01) | |
| G01R 33/04 | (2006.01) | |
| G01R 33/00 | (2006.01) | |

(52) U.S. Cl.
CPC .............. *G01N 27/82* (2013.01); *G01M 3/40* (2013.01); *G01R 33/02* (2013.01); G01R 33/0017 (2013.01); G01R 33/04 (2013.01); G01R 33/09 (2013.01)

(58) Field of Classification Search
CPC .......... G01N 27/82; G01M 3/40; G01M 5/00; G01M 5/0091; G01M 5/0025; G01R 33/00; G01R 33/02; G01R 33/0017; G01R 33/04; G01R 33/09
See application file for complete search history.

(56) References Cited

U.S. PATENT DOCUMENTS

| | | | |
|---|---|---|---|
| 8,274,279 B2* | 9/2012 | Gies ................... | G01N 27/9033 324/240 |
| 2003/0011363 A1* | 1/2003 | Wayman ................ | G01N 27/82 324/238 |
| 2014/0156067 A1* | 6/2014 | An ..................... | G01N 29/2412 700/245 |

* cited by examiner

*Primary Examiner* — Son T Le
(74) *Attorney, Agent, or Firm* — Perkins Coie LLP

(57) ABSTRACT

A handheld pipeline inspection tool for inspecting a section of pipe. The tool includes two wings mounted to opposing sides of a central body using hinges. Each wing includes an excitation coil and is rotatable about the hinges so that the wings may be positioned around pipes of different sizes. Each excitation coil is energized by alternating current (AC) produced by an AC generator within the body. The energized excitation coils generate magnetic fields that interact with the section of pipe. An array of magnetometers within the body detects variations in the magnetic field due to the presence of defects within the adjacent section of pipe. In this fashion, the handheld pipeline inspection tool facilitates the inspection of pipelines in unusual configurations and hard to access conditions.

20 Claims, 5 Drawing Sheets

PLANAR ARRAY PIPELINE INSPECTION TOOL

CROSS-REFERENCE TO RELATED APPLICATION(S)

This application claims the benefit of U.S. Provisional Patent Application No. 62/597,404 filed on Dec. 11, 2017, entitled PLANAR ARRAY PIPELINE INSPECTION TOOL, which is incorporated herein by reference in its entirety.

BACKGROUND

Inspection of various piping systems and pipelines for defects, cracks, corrosion, wear and the like is important for maintaining the integrity of such systems to avoid potentially catastrophic consequences from failure of pipes during use. In some applications, the piping systems are used to transport hot and/or corrosive materials. Often, such piping systems are provided with an exterior layer of insulation or the like that inhibits visual inspection of the piping system and conventional inspection systems that require direct access to the pipes. For example, piping systems used to transport petroleum products or the like over large distances often include a thick layer of polymeric insulation and an outer metal sheathing. Piping systems may also be coated or encased with a protective outer casing, such as a plastic or elastomeric outer jacket, which makes the systems extremely difficult and costly to effectively monitor for wear, corrosion, damage and similar defects.

Conventional pipeline inspection systems typically use insertable inspection probes called inline inspection pigs that are inserted directly into the pipe and travel along the pipe. An inspection pig may be self-propelled or may be carried through the pipe by the flow within the pipe. One obvious disadvantage of inspection pigs is that they require access to the interior of a pipe. For many pipe systems, accessing the pipe to insert the inspection pig can be problematic, as it typically requires shutting down the flow within the pipe, and some disassembly and/or use of an access port. Other pipe inspection systems may be arranged around the exterior surface of the pipeline and may utilize an induced magnetic field to inspect the pipe. These systems may be self-propelled using a wheel or track-mounted transportation system that pushes the inspection system down the length of the pipeline. However, these inspection systems are only usable on pipelines without bends and each inspection system is only usable for certain sizes of pipe. It would therefore be desirable to provide a pipeline inspection system that may be used for inspecting the condition of a pipe even when the pipe is not easily accessible by a conventional inspection system or when the pipe includes bends that inhibit the movement of the inspection system around the pipe, and that may be used for pipes of varying sizes.

DETAILED DESCRIPTION

A handheld pipeline inspection tool for inspecting a section of pipe is disclosed. The tool includes two wings mounted to opposing sides of a central body using hinges. Each wing includes an excitation coil and is rotatable about the hinges so that the wings may be positioned around pipes of different sizes. Each excitation coil is energized by alternating current (AC) produced by an AC generator within the body. The energized excitation coils generate magnetic fields that interact with the section of pipe. An array of magnetometers within the body detects variations in the magnetic field due to the presence of defects within the adjacent section of pipe. In this fashion, the handheld pipeline inspection tool facilitates the inspection of pipelines in unusual configurations and hard to access conditions.

Various embodiments of the invention will now be described. The following description provides specific details for a thorough understanding and an enabling description of these embodiments. One skilled in the art will understand, however, that the invention may be practiced without many of these details. Additionally, some well-known structures or functions may not be shown or described in detail, so as to avoid unnecessarily obscuring the relevant description of the various embodiments. The terminology used in the description presented below is intended to be interpreted in its broadest reasonable manner, even though it is being used in conjunction with a detailed description of certain specific embodiments of the invention.

Figure 1:
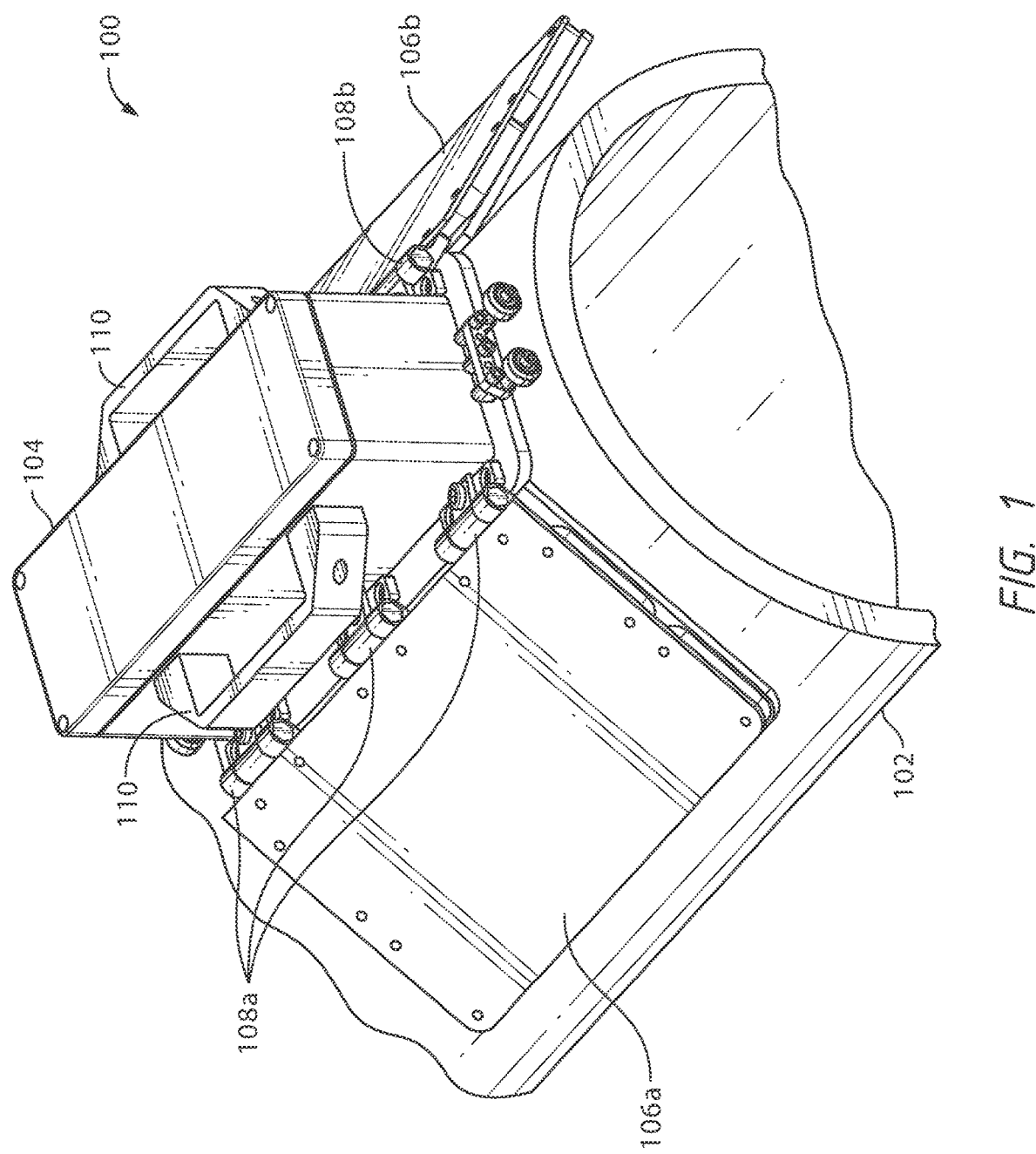
FIG. 1 is a perspective view of a handheld pipeline inspection tool arranged over a section of piping.

FIG. 1 is a perspective view of a handheld pipeline inspection tool 100 arranged over a section of pipe 102. The tool 100 includes an a central box-shaped body 104 enclosing electronics and a power supply, and first and second wings 106a and 106b attached to the body 104. The first wing 106a is rotatably coupled to the central body 104 with a first hinge 108a and the second wing 106b is rotatably coupled to the body 104 with a second hinge 108b. Handles 110 are attached to the exterior surface of the body 104 such that a user of the tool 100 may grasp the tool with the handles 110 and arrange the position of the tool 100 over the pipe 102.

The body 104 includes an array of magnetometers (not shown) that is positioned near a bottom surface of the body 104. When a user of the tool 100 desires to use the tool 100 to test a section of pipe, the user uses the handles 110 to arrange the body 104 over the pipe 102 such that the array of magnetometers is positioned directly over the pipe 102. The bottom surface of the body 104 may be formed from a nonconductive material (e.g., plastic) that allows magnetic and electrical fields to propagate through the material with minimal interference or reduction in sensitivity. The array of magnetometers is used to measure and detect the presence of magnetic fields in the section of pipe 102 under test.

Power is provided to the tool either by an external power source using a cable or by an internal rechargeable battery that is contained in the body. The body 104 includes a controllable alternating current (AC) generator (not shown) that is connected to the first and second wings 106a and 106b, and that provides an alternating current to respective first and second excitation coils (not shown) within the wings 106*a*, 106*b* in order to energize them. As will be discussed in greater detail below, energizing the first and second excitation coils leads to the generation of magnetic fields by the excitation coils. The magnetic fields extend outward from the tool wings, inducing a magnetic field within the walls of the pipe 102 when the tool 100 is arranged over the pipe 102. In some embodiments, the alternating current has a low frequency, such as a frequency less than 100 Hz, less than 10 Hz, or even less than 5 Hz. However, the optimal frequency range will depend on the particular geometry and material properties of the pipe being examined. It is appreciated that one of ordinary skill in the art will be sufficiently able to identify a suitable frequency for a given section of piping depending on the pipe size and composition. Additional details about alternating current waveforms that may be used by the tool may be found in U.S. Provisional Application No. 62/452,952, filed Jan. 31, 2017, entitled "EDDY CURRENT PIPELINE INSPECTION USING SWEPT FREQUENCY," which is hereby incorporated by reference in its entirety.

The strength of the magnetic field induced in the walls of the piping section 102 by the energized excitation coils is inversely proportional to the distance between the excitation coils and the piping section. To allow the tool to be properly fit to different size pipes and pipe coverings, the first and second wings 106*a* and 106*b* are rotatably coupled to the body 104 by the first and second hinges 108*a* and 108*b*. After the tool 100 has been arranged over the pipe 102, a user of the tool 100 may rotate the first and second wings 106*a* and 106*b* about the first and second hinges 108*a* and 108*b* to bring the wings 106*a*, 106*b* closer to the exterior surface of the pipe 102. Rotating the wings reduces the distance between the excitation coils and the pipe, thereby increasing the strength of the magnetic fields that are induced in the pipe 102.

In some embodiments, the hinges 108*a*, 108*b* comprise torque hinges that are configured to hold the wings 106*a*, 106*b* at a given orientation. Torque hinges, which are sometimes referred to as constant torque friction hinges, provide continuous resistance throughout the entire range of motion of the hinges. In embodiments where the hinges 108*a*, 108*b* include torque hinges, a user of the tool 100 may rotate a given wings 106*a*, 106*b* about the respective hinges 108*a*, 108*b* until the wing is at a desired position. The torque hinges then hold the wing 106*a*, 106*b* at that desired position without requiring an additional locking mechanism to ensure that the wing remains securely fixed at that position. However, the use of torque hinges is merely an example. In some embodiments, the first and second hinges 108*a* and 108*b* comprise freely-rotating hinges and an adjustable locking mechanism that is used to lock the first and second wings 106*a* and 106*b* at a desired orientation. In still other embodiments, the first and second wings 106*a* and 106*b* are attached to the body 104 at a fixed position such that the wings 106*a*, 106*b* are not rotatable relative to the body 104. One skilled in the art will appreciate that other attachment mechanisms may be used to attach the first and second wings 106*a* and 106*b* to the body 104 other than those disclosed herein.

The body 104 includes a data acquisition system that is operatively connected to the array of magnetometers and the AC power supply. The data acquisition system may include one or more microprocessors or microcontrollers, sensors, and analog-to-digital converters to convert measured analog signals into digital representations of those signals. A representative data acquisition system is disclosed in the U.S. Provisional Application No. 62/452,952. The data acquisition system monitors the application of the AC power to the excitation coils in the first and second wings 106*a* and 106*b* by the AC generator. As power is applied to the excitation coils, the data acquisition system receives sensor data from the array of magnetometers. As will be described in additional detail herein, the received sensor data may then be sent to a data processing system to determine if the pipe 102 includes any defects. The body may be operatively connected to the remote data processing system (e.g., a laptop) using either a wired or a wireless connection. In some embodiments, all or a portion of the data processing system may be located within the body 104 such that at least some of the processing of the received sensor data is performed by the tool 100. After pre-processing the received sensor data, the body may transmit the pre-processed sensor data to the remote data processing system for further processing and analysis. In other embodiments, the body 104 may not include a data processing system and the tool 100 may be configured to send the received sensor data from the data acquisition system to the remote data processing system without performing any initial processing.

Figure 2:
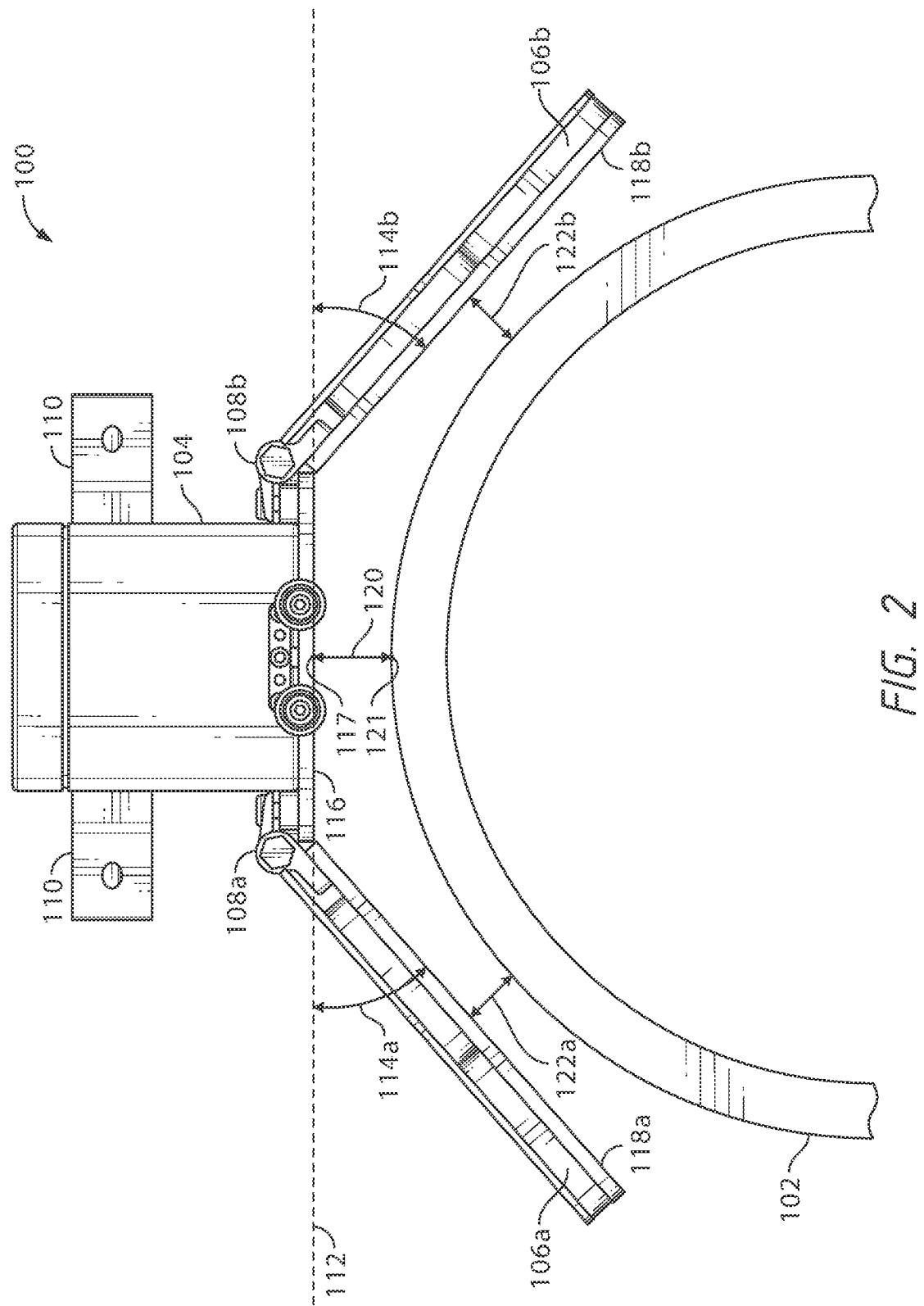
FIG. 2 is a side view of the handheld pipeline inspection tool arranged over the section of piping.

FIG. 2 is a side view of the handheld pipeline inspection tool 100 arranged over the pipe 102. The body 104 may be positioned over the pipe 102 such that a midpoint 117 of the bottom surface 116 of the body is separated by a distance 120 from a point 121 on the pipe 102, where a line segment drawn from the midpoint 117 to the point 121 is perpendicular to the bottom surface 116 of the body 104. The first wing 106*a* may have a first wing surface 118*a* and the second wing 106*b* may have a second wing surface 118*b*. The first wing 106*a* may be rotated about the first hinge 108*a* towards the pipe 102 until the first wing surface 118*a* forms a first wing angle 114*a* with a line 112 and the second wing 106*b* may be rotated about the second hinge 108*b* towards the pipe 102 until the second wing surface 118*b* forms a second wing angle 114*b* with the line 112, where the line 112 is a horizontal line that intersects with and is parallel to the bottom surface 116. Preferably, the first and second wing angles are the same. At times, however, structures or pipe configurations may not allow the first and second wing angles to be the same during tool use.

The array of magnetometers (not shown) are positioned along the bottom surface 116 of the body 104. As will be discussed in greater detail below, the array of magnetometers is arranged along a line that intersects with the midpoint 117. When a user desires to use the tool 100 to detect defects in the pipe 102 at a point that is near the point 121, the user arranges the array of magnetometers over the point 121 such that the midpoint 117 is separated from the point 121 by a distance 120. In some embodiments, the distance 120 may be 1 inch. However, this is merely an example. In other embodiments, the distance 120 may be less than 1 inch, between 1 and 2 inches, less than 5 inches, or between 5 and 10 inches. The desired distance is adjusted depending on the strength of the generated magnetic fields and the sensitivity of the array of magnetometers. Typically, positioning the body closer to the pipe will result in better resolution and accuracy in detecting pipe defects.

As previously mentioned, the first and second wings 106*a* and 106*b* are rotatable about the first and second hinges 108*a* and 108*b* such that the first wing surface 118*a* forms a first wing angle 114*a* with the horizontal line 112 and the second wing surface 118*b* forms a second wing angle 114*b* with the horizontal line 112. When a current is provided to the excitation coils (not shown) within the wings 106*a*, 106*b*, the excitation coils generate a magnetic field around the wings 106*a*, 106*b*. As will be discussed in further detail below, the generated magnetic field induces a magnetic field within the walls of the pipe 102. The strength of these induced magnetic fields is inversely proportional to the distance between the wings 106a, 106b and the pipe 102 and is directly proportional to the magnitude of the current provided to the excitation coils. In order to increase the strength of the induced magnetic fields, the first and second wings 106a and 106b may be rotated about the respective first and second hinges 108a and 108b to decrease the distance between the first and second wing surfaces 118a and 118b and the pipe 102.

After arranging the tool 100 over the pipe 102, a user of the tool 100 may rotate the first and second wings 106a and 106b about the respective first and second hinges 108a and 108b to the first and second wing angles 114a and 114b. In some embodiments, the first wing angle 114a may be equal to the second wing angle 114b. For example, the first wing angle 114a may be 45° and the second wing angle 114b may be equal to 45°. However, this is merely an example. In other embodiments, the first and second wing angles 114a and 114b may be different. For example, the first wing angle 114a may be 45° and the second wing angle 114b may be 30° or the first wing angle 114a may be 35° and the second wing angle 114b may be 40°. In general, the first and second wing angles 114a and 114b may be any desired angles. It is appreciated that one of ordinary skill in the art is sufficiently capable of choosing first and second wing angles about which to rotate the wings in order to achieve the desired properties of the induced magnetic fields within the walls of the pipe 102.

If the first and second wing surfaces 118a and 118b are arranged too close to the exterior surface of the pipe 102, however, the magnetic fields induced within the pipe 102 may not behave correctly. To prevent this, the first and second wings 106a and 106b may only be rotated about the first and second hinges 108a and 108b until the first and second wing angles 114a and 114b reach respective first and second maximum angles. The first maximum angle may be defined as the largest angle that the first wing 106a can rotate before at least one point on the first wing surface 118a is separated from any point on the piping section 102 by a first minimum distance 122a. Similarly, the second maximum angle may be defined as the largest angle that the second wing 106b can rotate before at least one point on the second wing surface 118b is separated from any point on the piping section 102 by a second minimum distance 122b. In other words, the wings 106a, 106b may be configured to rotate about the hinges 108a, 108b until at least one point on each of the bottom surfaces 118a, 118b is separated from any point on the pipe 102 by a distance less than the minimum distances 122a, 122b.

In some embodiments, stand-off guides or pegs (not shown) may be attached to the first and second wing surfaces 118a and 118b. The stand-off guides project perpendicularly from the wing surfaces and extend a desired minimum distance that the wings are to remain separated from the external surface of the pipe. The purpose of the stand-off guides is to ensure that the wings don't touch the surface of the pipe as a result of operator misalignment of the tool with the pipe. The stand-off guides may be formed of plastic or other non-conductive material that doesn't impair the magnetic fields generated by each wing. In some embodiments, the height of the stand-off guides may be adjustable to allow the minimum desired distance to be configured depending on the particular pipe being tested.

The first and second minimum distances 122a and 122b may be dependent on the material used to make walls of the pipe 102, the thickness of the walls, the size of the wings 106a, 106b, and/or the current that is provided by AC generator to the wings excitation coils within the wings 106a, 106b. In embodiments where the pipe 102 has a uniform composition and structure, the first and second wings 106a and 106b are the same size, and the current provided to the excitation coils within the wings 106a, 106b is equal, the first and second minimum distances 122a and 122b may be equal. For example, in these embodiments, the first and second minimum distances 122a and 122b may both be 1 inch, may be less than 1 inch, may be between 1 and 2 inches, may be less than 5 inches, or may be any other desired distance. However, this is merely an example. In other embodiments, first and second minimum distances may be 0 inches and the first and second wings 106a and 108b may both be rotated until a point on each of the wing surfaces 118a, 118b is tangent to a point on the exterior surface of the pipe 102 (i.e., until the first and second wing surfaces 118a and 118b are touching the pipe 102).

Figure 3:
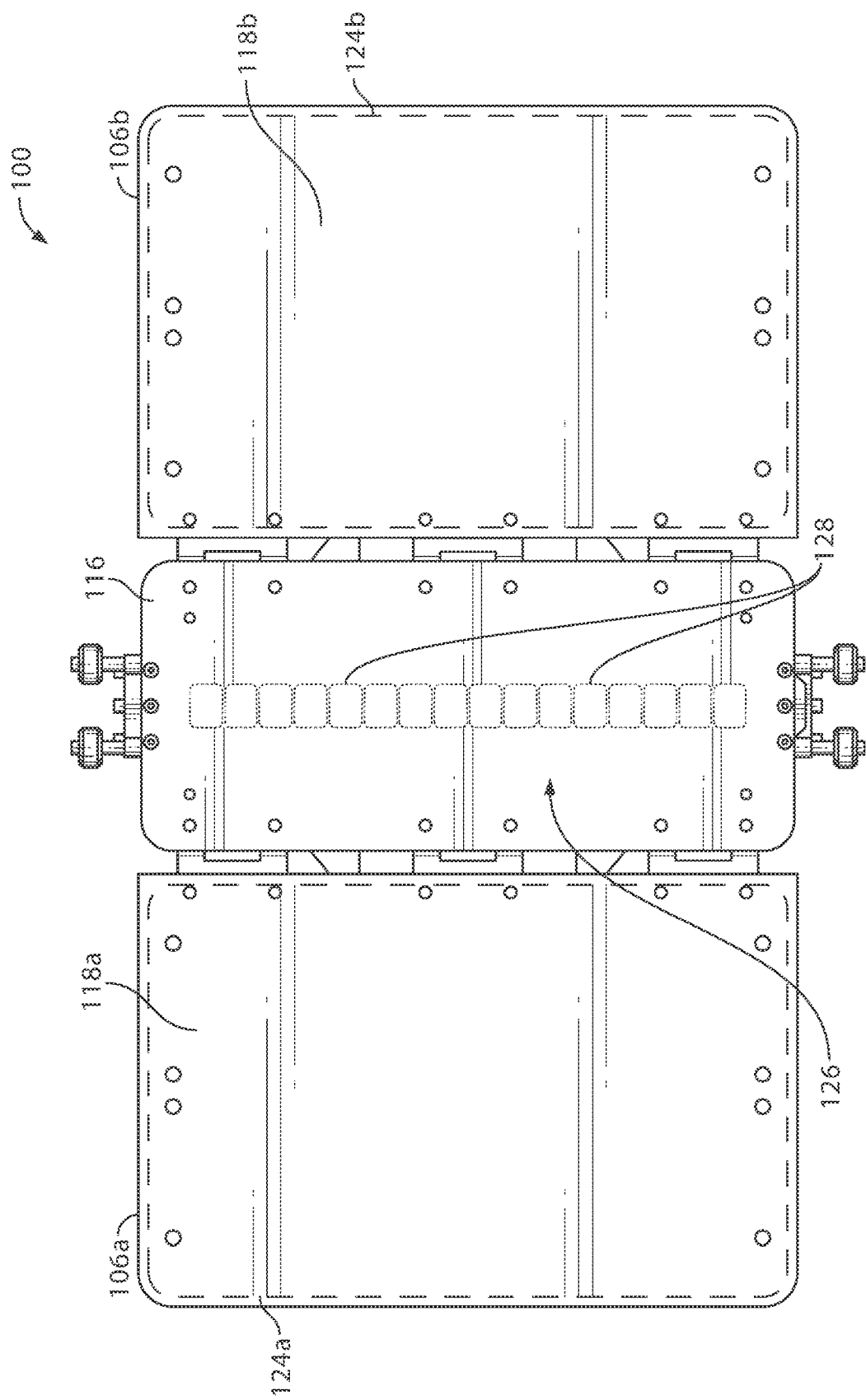
FIG. 3 is a bottom view of the handheld pipeline inspection tool.

FIG. 3 is a bottom view of the tool 100. The first wing 106a includes a first excitation coil 124a that is arranged adjacent to the first wing surface 118a and the second wing 106b includes a second excitation coils 124b that is arranged adjacent to the second wing surface 118b. The excitation coils may be encapsulated in the wing structure itself, or may be affixed to the exterior surface of the wing. The excitation coils 124a, 124b are coupled to the AC generator within the body 104 and configured to receive an alternating current from the generator. An array 126 of magnetometers 128 is arranged adjacent to the bottom surface 116 of the body 104. As previously discussed, the magnetometers 128 are configured to detect and measure magnetic fields induced within the section of pipe 102 (not shown) by the first and second excitation coils 124a and 124b.

In the embodiment shown in FIG. 3, the array 126 includes 16 magnetometers 128 arranged in a 1×16 array that is positioned on or near the middle of the bottom surface 116 of the body 104. However, this is merely an example. In other embodiments, the tool 100 may include 32 magnetometers arranged in a 2×16 array, 36 magnetometers arranged in a 3×12 array, or 40 magnetometers arranged in a 4×10 array. In general, the tool 100 may include any desired number of magnetometers 128 arranged in any desired layout. In some embodiments, the magnetometers 128 in the array 126 may be vector magnetometer sensors, and more particularly fluxgate magnetometer sensors. However, this is merely an example. In other embodiments, other types of magnetometers, such as magnetoresistive magnetometers (e.g., giant magnetoresistive or anisotropic magnetoresistive magnetometer sensors) may be used.

The first and second excitation coils 124a and 124b are each formed from at least one loop of conductive material disposed along the perimeters of the first and second wings 106a and 106b. The wings 106a, 106b may each include a printed circuit board (PCB) having a plurality of traces printed onto the board. The traces may be formed from a conductive material (e.g., a metal such as copper) and may be printed around the edge of each of the PCBs to form the at least one loop of conductive material for each excitation coil 124a, 124b. The PCBs may have sizes that are similar to the sizes of the first and second wings 106a and 106b and may be arranged within the respective wings 106a, 106b such that the traces are positioned near the edges of the wings. In some embodiments, the excitation coils 124a, 124b each include 125 loops of conductive material formed from conductive traces printed onto the PCB. However, this is merely an example. In other embodiments, the excitation coils 124a, 124b each include 100 loops, 150 loops, 50 loops, or any other desired number of loops.

However, the excitation coils 124a, 124b being formed from conductive traces printed onto a PCB to form the loops of conductive material is merely an example. If desired, the excitation coils 124a, 124b may be formed form some other type of conductive material. For example, the coils 124a, 124b may be formed from loops of flexible wire that are disposed around the perimeters of the first and second wings 106a and 106b. In general, the excitation coils 124a, 124b may be formed from any desired conductive material.

During operation of the tool 100, the excitation coils 124a and 124b are energized with the alternating current generated by the AC generator. As is well-known in the art, running a current through a wire generates a magnetic field around the wire. When an excitation coil 124a, 124b is energized by an alternating current, a magnetic field is generated by the excitation coil. When the tool 100 is arranged over the section of the pipe 102 that is to be examined, the generated magnetic field will propagate towards the pipe 102 and induce a magnetic field in the conductive portions of the pipe 102 (e.g., the metal walls of the pipe 102) that are near the tool 100. Magnetometers 128 within the tool 100 are then used to detect and measure the induced magnetic field.

At a given point near the energized loop, the magnetic field will have a given direction and a magnitude. The direction of the magnetic field is dependent on the position of the point relative to the loop and the polarity of the current used to energize the conductive material at any point in time. The strength of the magnetic field is dependent on the magnitude of current flowing through the excitation coils, the diameter and configuration of the excitation coils, and the distance between the loop and the point at which the magnetic field is measured. In embodiments where the current is an alternating current, the polarity of the electric field switches at regular intervals, causing the generated magnetic field to switch direction as well. For example, in embodiments where the current has a frequency of 10 Hz, the direction of the generated magnetic field may switch directions 10 times every second.

In some embodiments, the alternating current provided to the first excitation coil 124a is the same as the current provided to the second excitation coil 124b. In these embodiments, the current provided to the first excitation coil 124a is in phase with the current provided to the second excitation coil 124b. In some embodiments, however, the first and second excitation coils 124a and 124b are coupled to the AC generator within the body 104 such that the current in the first excitation coil 124a is 180 degrees out of phase (i.e., flows in the opposite direction) as the current in the second excitation coil 124b. For example, at a given point in time, the current flowing in the first excitation coil 124a may be flowing in a clockwise direction while the current flowing in the second excitation coil 124b may be flowing in a counterclockwise direction. When the currents in the two coils 124a, 124b move in opposing directions, the magnetic fields generated by the two coils have opposing directions. For example, at an instant where the first excitation coil 124a is flowing in a clockwise direction and the second excitation coil 124 is flowing in a counterclockwise direction, the magnetic field generated by the first excitation coil 124a may have a direction pointed upwards towards the first wing surface 118a (i.e., into the page) and the magnetic field generated by the second excitation coil 124b may have a direction pointed downwards away from the second wing surface 118b (i.e., out of the page).

When two energized loops of conductive material are positioned near each other, the two magnetic fields may interact with each other and the magnitude and direction of the combined magnetic field at a given point is determined by a linear combination of the magnitude and directions of the two fields at that point. For example, if the two magnetic fields have the same direction at a given point, the magnitude of the magnetic field measured at that point is equal to the sum of the magnitudes from the two fields and the direction of the combined field is the same as the original fields. On the other hand, if the two magnetic fields have opposite directions at the given point, the magnitude of the combined field at that point is equal to the difference between the two magnitudes and the direction of the combined field at that point is the same as the direction of the stronger of the two magnetic fields. If the two magnetic fields have directions that are not exactly the same or exactly opposite to each other at the given point, the combined magnetic field at a given point may have a strength and direction that is determined by performing a linear combination of the magnitude and directions of the two fields at that point.

Each of the magnetometers 128 may have a direction of sensitivity along which the magnetometers 128 are most sensitive to the presence of a magnetic field. In embodiments where the magnetometers 128 are vector magnetometers, the direction of sensitivity of the magnetometers 128 may be perpendicular to the bottom surface 116 of the body 104. In other words, each magnetometer 128 may only be capable of sensing a magnetic field below the magnetometer 128 if points directly below the magnetometer 128 have magnetic fields that have directional components perpendicular to the bottom surface 116 of the body 104. If the magnetic field below a given magnetometer 128 has a direction that is parallel to the surface 116, the magnetometer 128 may not be able to detect or measure the magnetic field. In embodiments where the current flowing through the first excitation coil 124a flows in the opposite direction from the current flowing through the second excitation coil 124b, the vertical component of the first magnetic field (i.e., the magnetic field generated by the first excitation coil 124a) at a given point between the first and second excitation coils 124a, 124b may cancel out (i.e., destructively interfere with) the vertical component of the second magnetic field (i.e., the magnetic field generated by the second excitation coil 124b) at that point. In this situation, a magnetometer 128, which has a vertical direction of sensitivity and is positioned over the given point, does not detect any magnetic field because the direction of the combined magnetic field at the given point has no vertical component and is therefore not sensible by the magnetometer 128.

Figure 4A:
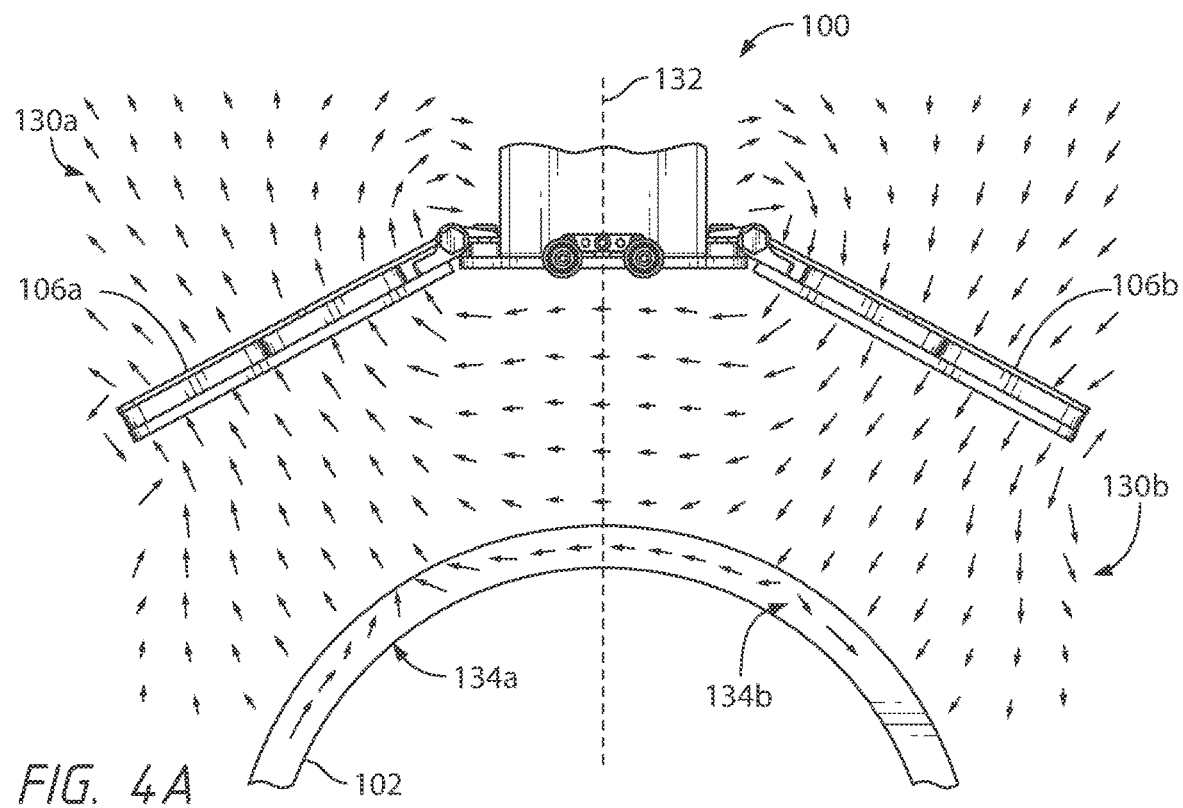
FIG. 4A is a side view of the handheld pipeline inspection tool and generated magnetic field arranged over a section of piping without a defect.

FIG. 4A shows a side view of the tool 100 arranged over a section of the pipe 102 having no defects. The excitation coils within the first and second wings 106a and 106b may be energized with an alternating current such that the excitation coil within the first wing 106a generates a first magnetic field 130a around the first wing 106a that has a direction generally pointed upwards towards the first wing 106a and the excitation coil within the second wing 106b generates a second magnetic field 130b around the second wing 106b having a direction generally pointed downwards towards the second wing 106b. When the tool 100 is positioned over the pipe 102, the first and second magnetic fields 130a and 130b induce a respective first and second magnetic fields 134a and 134b within the walls of the pipe 102.

As previously discussed, the vertical component of a combined magnetic field may be equal to 0 if the vertical component from a first magnetic field cancels out the vertical component from a second magnetic field. In the situation shown in FIG. 4A, the vertical components of the two magnetic fields 130a, 130b may cancel out (i.e., the combined magnetic field has no vertical component) at points directly below the magnetometers within tool 100 (i.e., points along line 132). In these embodiments, the magnetometers within the tool 100 may not detect any magnetic field because the magnetic field at points that fall along the direction of sensitivity for the magnetometers has no component pointed towards the magnetometers.

The first and second wings 106a and 106b are rotatable about the respective first and second hinges 108a and 108b. Rotating the wings 106a, 106b by a given amount may cause the generated magnetic fields 130a, 130b to also rotate. For example, if the first wing 106a is rotated such that the first wing angle 114a is 30° and the second wing 106b is rotated such that the second wing angle 114b is 45°, the direction of the first magnetic field 130a may be rotated 30° and the direction of the second magnetic field 130b may be rotated 45°. However, when the first and second magnetic fields 130a and 130b are rotated by two different amounts, the points where the vertical component of the combined magnetic field is zero (i.e., the points where the vertical component from the magnetic field 130a cancels out the vertical component from the magnetic field 130b) may be shifted away from the line 132. In this scenario, the magnetic field at points along the line 132 may now include a vertical component and the magnetometers within the tool 100 may detect the vertical component of the magnetic field. In order to ensure that the combined magnetic field at points along the line 132 has no vertical component, the first and second wings 106a and 106b may be rotated such that the first wing angle 114a equals the second wing angle 114b and the current flowing through the first excitation coil 124a should have the same magnitude as, and be 180° out of phase with, the current flowing through second excitation coil 124b.

The first and second magnetic fields 130a and 130b induce respective first and second magnetic fields 134a and 134b within the walls of the pipe 102. The behavior of the magnetic field within a conductive material is related to the physical properties of the material. For a material without any significant defects, such as cracks, corrosion, or pitting, the magnetic field propagates through the metal in a predictable manner, generally having a decreased magnitude at points further from the source of the magnetic field (i.e., the excitation coils) and having a direction similar to the direction of the magnetic field used to induce the field within the material. However, the presence of defects within the material causes the magnetic field within the material to be altered by the defects, causing abnormalities in the propagation of the field through the material. This phenomenon is often referred to as magnetic flux leakage.

Figure 4B:
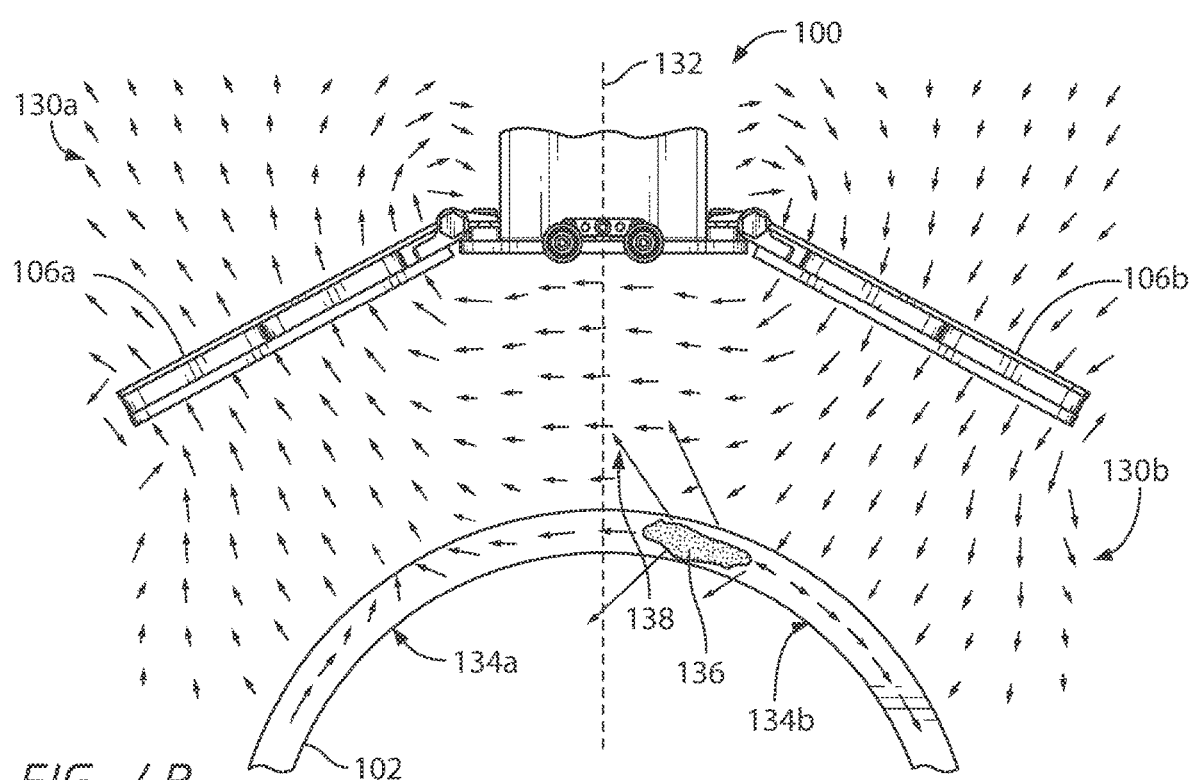
FIG. 4B is a side view of the handheld pipeline inspection tool and generated magnetic field arranged over a section of piping having a defect.

In the situation shown in FIG. 4A, the pipe 102 includes no significant defects and the magnetic fields 134a, 134b within the pipe 102 have magnitudes and directions similar to the magnitude and directions of the magnetic fields 130a, 130b outside of the pipe. However, in the situation shown in FIG. 4B, the pipe 102 includes a defect 136. The presence of the defect 136 within the pipe 102 causes the first and second magnetic fields 134a and 134b to be altered by the defect 136, causing abnormalities in the magnetic field. This phenomenon is often referred to as magnetic flux leakage because the magnetic field "leaks" from the pipe 102. When the magnetic fields 134a and 134b are altered by the defect 136, the resulting altered magnetic field 138 may have a vertical component that is sensible by the magnetometers 128 within the tool. In other words, the presence of the defect 136 within the pipe 102 leads to the formation of a deflected magnetic field 138 along the line 132. This deflected magnetic field 138 may have a vertical component, allowing the magnetometers 128 within the tool 100 to detect and measure the deflected magnetic field 138.

Rotating the first and second wings 106a and 106b so that the first wing angle 114a is equal to the second wing angle 114b ensures that the direction of the combined magnetic field at points along the line 132 does not have a vertical component that points towards (or away from) the magnetometers 128 when the tool 100 is arranged over a section of the pipe 102 that does not have any defects. However, when the tool 100 is arranged over a section of the pipe 102 that does include defects, and the first and second wing angles 114a and 114b are equal, the deflected magnetic field 138 may have a vertical component that is detectable by the magnetometers 128. In this way, the tool 100 is able to determine if the section of pipe 102 includes any defects by determining if the magnetometers 128 sense a magnetic field.

Figure 5:
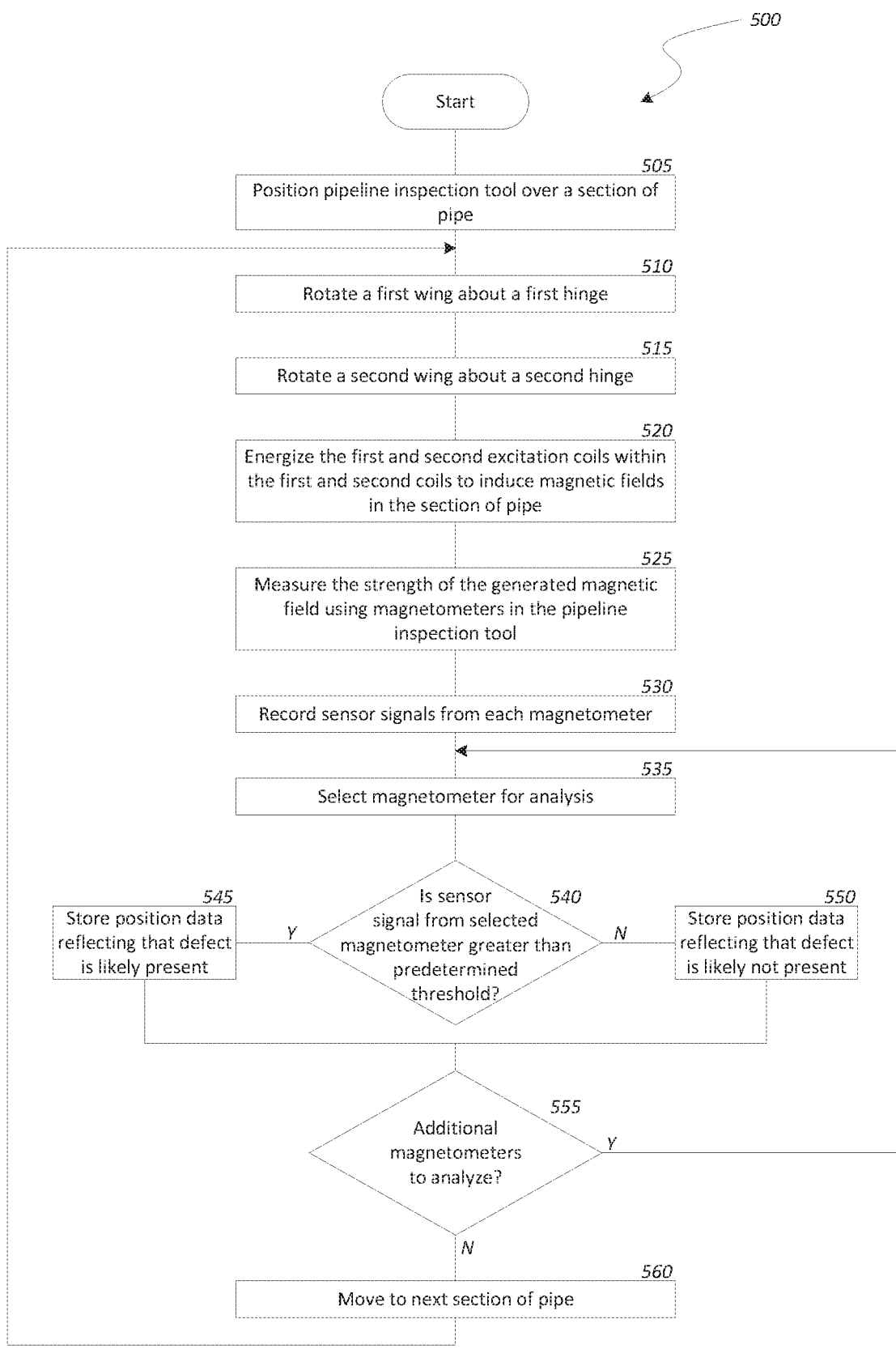
FIG. 5 is a method of using the handheld pipeline inspection tool to detect and record the location of defects in a section of piping.

FIG. 5 shows a method 500 of using a pipeline inspection tool to detect the presence of defects within a pipe. At step 505, a user positions the pipeline inspection tool over a section of pipe to check for defects, where positioning the pipeline inspection tool over a given section of pipe includes positioning the body such that the array of magnetometers is directly above the section of pipe to be tested and the bottom surface of the body is spaced a desired distance away from the surface of the pipe. The distance between the bottom surface of the body and the pipe may be predetermined by the user and may be based on the strength of the magnetic fields generated by the tool, the size and structure of the pipe, and/or the material that the pipe is formed from.

At steps 510 and 515, the user rotates the first and second wings about the respective first and second hinges in order to bring the two wings proximate the outer surface of the pipe. Rotating the first and second wings towards the pipe allows the first and second excitation coils, which are formed within the respective first and second wings, to also be rotated so that they are proximate the outer surface of the pipe. The first and second wings are rotated until a bottom surface of the wings are separated from the pipe by a predetermined minimum distance At step 520, the first and second excitation coils are energized with an alternating current generated by an AC generator in order to induce magnetic fields within the section of pipe. The first and second excitation coils each generate a magnetic field in the section of pipe and the two magnetic fields interfere with each other to form a combined magnetic field.

At step 525, magnetometers in the pipeline inspection tool measure the strength of the combined magnetic field in the section of pipe over which the tool is positioned. The magnetometers may only be sensitive to the vertical components of the induced magnetic fields (i.e., the component directed perpendicular to the bottom surface of the tool) such that, if the combined magnetic field does not have a vertical component, the magnetometers will not detect any magnetic field.

At step 530, a data acquisition system coupled to the magnetometers records sensor signals from each of the magnetometers. In some embodiments, the sensor values may be a simple indication of whether that magnetometer sensed a magnetic field at a given location. In other embodiments, the sensor value may also include the strength of the magnetic field measured by the magnetometers.

At step 535, a data processing system coupled to the data acquisition system selects one of the plurality of magnetometers for analysis and at step 540, the data processing system determines if the sensor signal from the selected magnetometer is greater than a predetermined threshold. If the selected sensor signal is greater than the predetermined threshold sensor value, the method proceeds to step 545. If the selected sensor signal is not greater than the predetermined threshold, the method proceeds to step 550.

At step 545, the system stores the position data of the magnetometer and indicates that a defect is likely present at the position. The position data may include axial position data (e.g., position along the axial length of the pipe) and/or radial position data (e.g., the radial position of the pipe over which the pipeline inspection tool is positioned).

At step 550, the system stores the position data of the magnetometer and indicates that a defect is likely not present at the position.

At step 555, the system determines if there are other magnetometers that have not yet been analyzed. If there are still some magnetometers that have not yet been analyzed, the method reverts back to step 535 to select a new magnetometer for analysis. If all of the magnetometers have been analyzed, the method proceeds to step 560.

At step 560, the pipeline inspection tool is moved to the next section of pipe to be examined and the method reverts back to the beginning.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A handheld pipeline inspection tool for inspecting a section of piping, comprising:
a first wing comprising a first frame and a first excitation coil;
a second wing comprising a second frame and a second excitation coil; and
a body, wherein the first and second wings are coupled to the body with respective first and second hinges, the body comprising:
an alternating current generator configured to generate first and second currents, wherein the first excitation coil is energized by the first current and the second excitation coil is energized by the second current; and
an array of magnetometers, wherein the array of magnetometers is configured to detect magnetic fields induced in a section of piping proximate to the first and second wings when the first and second excitation coils are energized.

2. The handheld pipeline inspection tool of claim 1, wherein the body comprises a first side and a second side that opposes the first side and wherein the first wing is coupled to the first side with the first hinge and the second wing is coupled to the second side with the second hinge.

3. The handheld pipeline inspection tool of claim 2, wherein the first and second hinges comprise adjustable torque hinges.

4. The handheld pipeline inspection tool of claim 2, wherein—
the body comprises a bottom surface,
the array of magnetometers is arranged adjacent to the bottom surface, and
the body is interposed between the first and second wings.

5. The handheld pipeline inspection tool of claim 4, wherein—
the first wing comprises a first wing surface configured to form a first angle with the bottom surface, and
the second wing comprises a second wing surface configured to form a second angle with the bottom surface.

6. The handheld pipeline inspection tool of claim 5, wherein the first angle is equal to the second angle.

7. The handheld pipeline inspection tool of claim 1, wherein the first and second currents are alternating currents.

8. The handheld pipeline inspection tool of claim 7, wherein the first current is in phase with the second current.

9. The handheld pipeline inspection tool of claim 1, wherein—
the array of magnetometers is arranged adjacent to a bottom surface of the body,
the first wing is rotatable about the first hinge such that a first surface of the first wing is movable between first and second angles with respect to the bottom surface, and
the second wing is rotatable about the second hinge such that a second surface of the second wing is movable between third and fourth angles with respect to the bottom surface.

10. A tool for inspecting a section of piping, comprising:
a body that comprises a generator to output an alternating current and a plurality of magnetometers arranged adjacent to a bottom surface of the body;
a first wing coupled to the body and rotatable about a first adjustable hinge, wherein a first surface of the first wing forms a first angle with the bottom surface and wherein the first wing comprises a first excitation coil configured to receive the alternating current; and
a second wing coupled to the body and rotatable about a second adjustable hinge, wherein—
the second wing comprises a second excitation coil configured to receive the alternating current,
a second surface of the second wing forms a second angle with the bottom surface of the body,
the plurality of magnetometers is interposed between the first and second wings, and
the plurality of magnetometers is configured to detect magnetic fields induced in the section of piping when the first and second excitation coils receive the alternating current.

11. The tool of claim 10 wherein the first angle is equal to the second angle.

12. The tool of claim 10, further comprising a power source in the body wherein the power source is configured to generate the alternating current.

13. The tool of claim 10, further comprising:
a data acquisition and processing system operatively connected to the plurality of magnetometers, wherein the plurality of magnetometers is configured to generate sensor data based on the detected magnetic fields and to provide the generated sensor data to the data acquisition and processing system, and wherein the data and processing system is configured to compare the generated sensor data to predetermined threshold data.

14. The tool of claim 10, wherein each magnetometer in the plurality of magnetometers is a vector magnetometer.

15. A method of using a pipeline inspection tool to examine a section of pipe, wherein the pipeline inspection tool comprises first and second excitation coils rotatably coupled to a body with respective first and second hinges, wherein the body comprises a plurality of magnetometers, the method comprising:
- positioning the pipeline inspection tool over the section of pipe;
- rotating the first excitation coil about the first hinge;
- rotating the second excitation coil about the second hinge;
- energizing the first and second excitation coils with a power source;
- recording a plurality of signals from the plurality of magnetometers to a data acquisition unit; and
- determining if a defect is present in the section of pipe by comparing each of the plurality of signals to a predetermined threshold signal.

16. The method defined in claim 15, wherein the section of the pipe comprises an outer surface, wherein the outer surface comprises a first point, a second point, and a third point, and wherein positioning the body over the section of pipe comprises positioning the plurality of magnetometers adjacent to the first point.

17. The method defined in claim 16, wherein rotating the first excitation coil around the first hinge comprises rotating the first excitation coil until a first surface of the first excitation coil is adjacent to the section of pipe at the second point and wherein rotating the second excitation coil around the second hinge comprises rotating the second excitation coil until a second surface of the second excitation coil is adjacent to the section of pipe at the third point.

18. The method defined in claim 15, wherein the power source generates an alternating current and wherein energizing the first and second excitation coils with a power source comprises providing the alternating current to the first and second excitation coils.

19. The method defined in claim 15, wherein energizing the first and second excitation coils with the power source induces a magnetic field in the section of pipe, the method further comprising:
- before recording the plurality of signals to the data acquisition unit, measuring the magnitude of the magnetic field in the section of pipe with the plurality of magnetometers; and
- generating the plurality of signals based on the measured magnitude of the magnetic field.

20. The method defined in claim 15, wherein the section of pipe comprises a first section of pipe and the plurality of signals comprises a first plurality of signals, the method further comprising:
- moving the pipeline inspection tool away from the first section of pipe;
- positioning the pipeline inspection tool over a second section of the pipe;
- energizing the first and second excitation coils with the power source;
- recording a second plurality signals from the plurality of magnetometers to the data acquisition unit; and
- determining if a defect is present in the second section of pipe.

* * * * *